(12) United States Patent
Cheng et al.

(10) Patent No.: US 8,618,554 B2
(45) Date of Patent: Dec. 31, 2013

(54) METHOD TO REDUCE GROUND-PLANE POISONING OF EXTREMELY-THIN SOI (ETSOI) LAYER WITH THIN BURIED OXIDE

(75) Inventors: Kangguo Cheng, Guilderland, NY (US); Bruce B. Doris, Brewster, NY (US); Ali Khakifirooz, Slingerlands, NY (US); Pranita Kulkarni, Slingerlands, NY (US); Ghavam G. Shahidi, Round Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 12/941,771

(22) Filed: Nov. 8, 2010

(65) Prior Publication Data

US 2012/0112207 A1 May 10, 2012

(51) Int. Cl.
*H01L 29/15* (2006.01)

(52) U.S. Cl.
USPC .............. 257/77; 257/E27.112; 257/E21.561; 257/347; 257/288; 257/213

(58) Field of Classification Search
USPC ............ 257/77, E27.112, E21.561, 347, 288, 257/213
See application file for complete search history.

(56) References Cited

U.S. PATENT DOCUMENTS

| | | | |
|---|---|---|---|
| 5,034,343 A | 7/1991 | Rouse et al. | |
| 5,882,987 A | 3/1999 | Srikrishnan | |
| 5,897,362 A | 4/1999 | Wallace | |
| 5,906,708 A | 5/1999 | Robinson et al. | |
| 6,228,691 B1 | 5/2001 | Doyle | |
| 6,342,725 B2 | 1/2002 | Falster | |
| 6,432,754 B1 | 8/2002 | Assaderaghi et al. | |
| 6,657,261 B2 | 12/2003 | Assaderaghi et al. | |
| 6,815,297 B1 | 11/2004 | Krivokapic et al. | |
| 6,849,901 B2 | 2/2005 | Falster | |
| 7,105,897 B2 | 9/2006 | Chen et al. | |
| 7,125,458 B2 * | 10/2006 | Bedell et al. | 148/239 |
| 7,183,576 B2 | 2/2007 | Chu et al. | |
| 7,323,370 B2 | 1/2008 | Furukawa | |
| 7,601,614 B2 | 10/2009 | Kwon et al. | |
| 2002/0094658 A1 | 7/2002 | Swanson et al. | |
| 2005/0282306 A1* | 12/2005 | Yamanaka | 438/57 |
| 2006/0255330 A1 | 11/2006 | Chen et al. | |
| 2007/0264795 A1 | 11/2007 | Miller et al. | |
| 2008/0042166 A1* | 2/2008 | Chan et al. | 257/183 |
| 2008/0265281 A1* | 10/2008 | Chen et al. | 257/190 |
| 2009/0267119 A1* | 10/2009 | Tamura | 257/288 |
| 2009/0311834 A1 | 12/2009 | Fenouillet-Beranger et al. | |

FOREIGN PATENT DOCUMENTS

WO WO-2010080292 A1 7/2010

OTHER PUBLICATIONS

Nguyen, Bich-Yen, et al., "A Review of SOI Technology and its Applications," Journal Integrated Circuits and Systems, 2009, vol. 4, No. 2, pp. 51-54.
Special Feature: Memory & Low Power, ASN No. 6.

* cited by examiner

*Primary Examiner* — Eva Yan Montalvo
(74) *Attorney, Agent, or Firm* — Novak Druce Connolly Bove + Quigg LLP; Louis J. Percello, Esq.

(57) ABSTRACT

The present disclosure, which is directed to ultra-thin-body-and-BOX and Double BOX fully depleted SOI devices having an epitaxial diffusion-retarding semiconductor layer that slows dopant diffusion into the SOI channel, and a method of making these devices. Dopant concentrations in the SOI channels of the devices of the present disclosure having an epitaxial diffusion-retarding semiconductor layer between the substrate and SOI channel are approximately 50 times less than the dopant concentrations measured in SOI channels of devices without the epitaxial diffusion-retarding semiconductor layer.

6 Claims, 7 Drawing Sheets

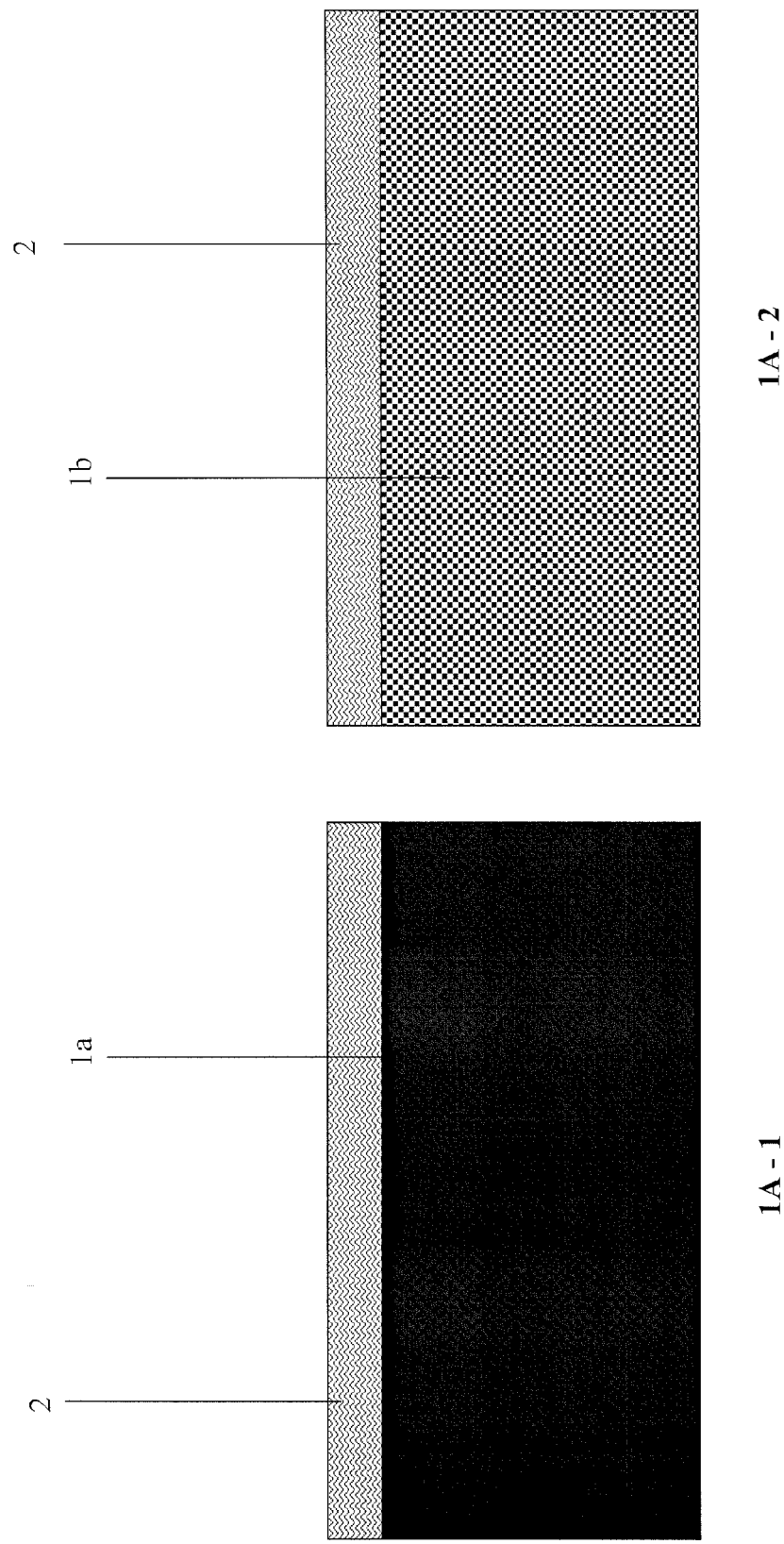

METHOD TO REDUCE GROUND-PLANE POISONING OF EXTREMELY-THIN SOI (ETSOI) LAYER WITH THIN BURIED OXIDE

TECHNICAL FIELD

The present disclosure relates to ultra-thin-body-and-BOX ("UTBB") and Double BOX fully depleted SOI devices having an epitaxial diffusion-retarding semiconductor layer between the substrate and buried oxide layers, as well as to a method of making these devices. The epitaxial diffusion-retarding semiconductor layer of these devices, which is crystalline in nature, slows the rate of dopant diffusion from the substrate into the SOI channel. More generally, the present disclosure relates to a method of reducing dopant diffusion into the SOI channel of an SOI device after front-end-of-line (FEOL) thermal budget processing.

BACKGROUND OF THE DISCLOSURE

To meet the increasing demands for smaller electronic devices, CMOS devices have continuously been scaled down. One problem associated with CMOS scaling involves short channel effects (SCE's). Ultra-thin-body-and-BOX (i.e., UTBB, UT2B, or UTB2) fully depleted SOI devices are an attractive candidate for further CMOS scaling due to their superior SCE control, smaller threshold voltage (Vt) variability, and compatibility with mainstream planar CMOS technology. Compared to conventional ETSOI devices, UTBB improves SCE by further reducing electric field coupling between source and drain with a thinner BOX and ground-plane (GP). By applying appropriate substrate bias and GP doping/polarity, multi-Vt devices can be realized with a simple gate stack. Ground Plane doping of ~5e18/cm3 is required to achieve desirable Vt modulation and optimum GP resistance. The substrate-bias provides an extra dynamic power capability at the device level.

Doping of the UTBB and Double BOX devices of the instant disclosure can be done by (1) using a thin-BOX SOI wafer with a predoped substrate from the vendor or (2) by implanting ions into an undoped substrate thin-BOX SOI wafer. For technologically relevant BOX thicknesses of 10-25 nanometers, the ion implantion through the SOI layer causes substantial "poisoning" of the SOI channel. This is problematic because the dopant concentration in the thin SOI channel after ion implantation may be ~5-8e17/cm$^3$, and could lead to increased Vt variability due to random-dopant fluctuations. One way to circumvent this problem is by using a thin-BOX ETSOI substrate with a predoped substrate. However, experiments on such predoped UTBB substrates have shown that the dopant diffuses from the substrate through the thin-BOX and into the SOI channel when exposed to the FEOL thermal budget resulting in punch-through (shorted) devices. Therefore, it would be desirable to fabricate a UTBB device wherein the rate of dopant diffusion into the SOI channel is reduced after FEOL thermal budget for devices utilizing predoped or implanted substrates.

SUMMARY OF THE DISCLOSURE

The present disclosure therefore provides for ultra-thin-body-and-BOX and Double BOX fully depleted SOI devices having an epitaxial diffusion-retarding semiconductor layer, as well as methods of making these devices. The epitaxial diffusion-retarding semiconductor layer, which is crystalline in nature, slows the rate of dopant diffusion from the substrate into the SOI channel. The dopant concentration in the SOI channel of devices of the present disclosure, which comprise an epitaxial diffusion-retarding semiconductor layer, are approximately 50 times less than the dopant concentration in SOI channels of devices without the epitaxial diffusion-retarding semiconductor layer.

One aspect of the present disclosure is an ultra-thin-body-and-BOX or a Double BOX fully depleted SOI device having an epitaxial diffusion-retarding semiconductor layer between the buried oxide layer and substrate layer of the SOI device. The ultra-thin-body-and-BOX device comprises a first substrate; an epitaxial diffusion-retarding semiconductor layer on top of the first substrate; a thin oxide layer on top of the epitaxial diffusion-retarding semiconductor layer; and an SOI channel on top of the thin oxide layer. The Double BOX fully depleted SOI device comprises:

a first substrate;
a first thin oxide layer on top of the first substrate;
a conducting layer on top of the first thin oxide layer;
an epitaxial diffusion-retarding semiconductor layer on top of the conducting layer;
an optional second thin oxide layer on top of the epitaxial diffusion-retarding semiconductor layer; and
an SOI channel comprising a thin layer of undoped silicon on top of the epitaxial diffusion-retarding semiconductor layer, or on top of the second thin oxide layer, if present.

The first substrate of the SOI devices may be undoped or predoped. The epitaxial diffusion-retarding semiconductor layer typically comprises elemental semiconductor material or compound semiconductor material, has low or no defects (e.g., stacking faults, dislocation pipes, etc.), and is about 10 to about 30 nanometers thick. More typically, the epitaxial diffusion-retarding semiconductor layer comprises Si:C, wherein Si:C has about 1-2% C, or SiGe. The amount of defects in the epitaxial diffusion-retarding semiconductor layer directly correlates with the amount of C in Si:C. The C concentration in the Si:C also correlates with the diffusion rate of dopant through the epitaxial diffusion-retarding semiconductor layer. Therefore, by incorporating more than 1% C, a thinner epitaxial diffusion-retarding semiconductor layer may be used. The epitaxial diffusion-retarding semiconductor layer, which is crystalline in nature, slows the diffusion rate of ground-plane ("GP") dopant, such as boron, phosphorous, indium, or arsenic, from the substrate into the SOI channel.

A second aspect of the present disclosure is a handle wafer comprising a substrate and an epitaxial diffusion-retarding semiconductor layer on top of the substrate. The substrate may be undoped or predoped. The epitaxial diffusion-retarding semiconductor layer typically comprises elemental semiconductor material or compound semiconductor material, has low or no defects (e.g., stacking faults, dislocation pipes, etc.), and is about 10 to about 30 nanometers thick. More typically, the epitaxial diffusion-retarding semiconductor layer comprises Si:C, wherein Si:C has about 1-2% C, or SiGe. The amount of defects in the epitaxial diffusion-retarding semiconductor layer directly correlates with the amount of C in Si:C. The C concentration in the Si:C also correlates with the diffusion rate of dopant through the epitaxial diffusion-retarding semiconductor layer. Therefore, by incorporating more than 1% C, a thinner epitaxial diffusion-retarding semiconductor layer may be used. The epitaxial diffusion-retarding semiconductor layer, which is crystalline in nature, slows the diffusion rate of ground-plane ("GP") dopant, such as boron, phosphorous, indium, or arsenic, from the substrate into the SOI channel.

A third aspect of the present disclosure is a CMOS comprising the ultra-thin-body-and-BOX or a Double BOX fully depleted SOI device having an epitaxial diffusion-retarding semiconductor layer between the buried oxide layer and substrate layer of the SOI device. The substrate layer of the SOI device may be undoped or predoped. The epitaxial diffusion-retarding semiconductor layer typically comprises elemental semiconductor material or compound semiconductor material, has low or no defects (e.g., stacking faults, dislocation pipes, etc.), and is about 10 to about 30 nanometers thick. More typically, the epitaxial diffusion-retarding semiconductor layer comprises Si:C, wherein Si:C has about 1-2% C, or SiGe. The amount of defects in the epitaxial diffusion-retarding semiconductor layer directly correlates with the amount of C in Si:C. The C concentration in the Si:C also correlates with the diffusion rate of dopant through the epitaxial diffusion-retarding semiconductor layer. Therefore, by incorporating more than 1% C, a thinner epitaxial diffusion-retarding semiconductor layer may be used. The epitaxial diffusion-retarding semiconductor layer, which is crystalline in nature, slows the diffusion rate of ground-plane ("GP") dopant, such as boron, phosphorous, indium, or arsenic, from the substrate into the SOI channel.

Yet another aspect of the present disclosure is a method of making an ultra-thin-body-and-BOX fully depleted SOI device having an epitaxial diffusion-retarding semiconductor layer between the buried oxide layer and substrate layer of the handle wafer, wherein the epitaxial diffusion-retarding semiconductor layer slows the diffusion rate of dopants from the substrate of the handle wafer into the SOI channel. This method comprises:
(A) preparing a handle wafer by providing a first substrate and growing an epitaxial diffusion-retarding semiconductor layer over a top surface of the first substrate;
(B) preparing a donor wafer by providing a second undoped substrate and preparing a thin oxide layer on a top surface of the second undoped substrate;
(C) bonding the thin oxide layer of the donor wafer to the epitaxial diffusion-retarding semiconductor layer of the handle wafer;
(D) removing a portion of the second undoped substrate of the donor wafer from the handle wafer leaving a thin layer of the second undoped substrate of the donor wafer to form an SOI channel; and
(E) implanting ions into the first substrate to form a ground plane.

Removal of the portion of the second undoped substrate of the donor wafer may be accomplished using back-etch SOI or SIMOX techniques that are known in the art. Most typically, a "Smart-Cut®" process is used to remove a portion of the donor wafer from the handle wafer. When implanting ions into the first substrate, it is desirable to locate a peak concentration of the ions at an interface of the epitaxial diffusion-retarding semiconductor layer and the thin oxide layer. This can be accomplished by adjusting the energy and dopant dosage according to methods well known in the art. The first substrate of the handle wafer may be undoped or predoped. The thin oxide layer may be prepared by thermally depositing the thin oxide layer over the top of the substrate, or by using dry/wet oxidation techniques. The epitaxial diffusion-retarding semiconductor layer typically comprises elemental semiconductor material or compound semiconductor material, has low or no defects (e.g., stacking faults, dislocation pipes, etc.), and is about 10 to about 30 nanometers thick. More typically, the epitaxial diffusion-retarding semiconductor layer comprises Si:C, wherein Si:C has about 1-2% C, or SiGe. The amount of defects in the epitaxial diffusion-retarding semiconductor layer directly correlates with the amount of C in Si:C. The C concentration in the Si:C also correlates with the diffusion rate of dopant through the epitaxial diffusion-retarding semiconductor layer. Therefore, by incorporating more than 1% C, a thinner epitaxial diffusion-retarding semiconductor layer may be used.

The epitaxial diffusion-retarding semiconductor layer, which is crystalline in nature, slows the diffusion rate of ground-plane ("GP") dopant, such as boron, phosphorous, indium, or arsenic, from the substrate into the SOI channel. The dopant concentration in the SOI channel of the devices of the present disclosure, which comprise an epitaxial diffusion-retarding semiconductor layer, are approximately 50 times less after exposure to FEOL thermal budget than the dopant concentration in SOI channels of devices without the epitaxial diffusion-retarding semiconductor layer.

Yet another aspect of the present disclosure is a method of making a Double BOX fully depleted SOI device having an epitaxial diffusion-retarding semiconductor layer between a top buried oxide layer (closer to the SOI layer) and a conducting layer, wherein the epitaxial diffusion-retarding semiconductor layer slows the diffusion rate of dopants from the substrate of the handle wafer, through the thin oxide layer, and into the SOI channel. This method comprises:
(A) preparing a handle wafer by providing a first substrate, depositing or thermally growing a first thin oxide layer over a top surface of the first substrate, forming a conducting layer over a top surface of the first thin oxide layer using in-situ doped polysilicon or heavily doped crystalline silicon, or a metal film, growing an epitaxial diffusion-retarding semiconductor layer over a top surface of the conducting layer, and optionally depositing or thermally growing a second thin oxide layer over a top of the epitaxial diffusion-retarding semiconductor layer;
(B) preparing a donor wafer by providing a second substrate and depositing a thin SiGe layer over a top surface of the second substrate, growing an undoped silicon layer on a top surface of the SiGe layer, and optionally depositing or thermally growing a thin oxide layer on a top surface of the undoped silicon layer;
(C) bonding the undoped silicon layer or optional thin oxide layer of the donor wafer to the epitaxial diffusion-retarding semiconductor layer or optional second thin oxide layer of the handle wafer; and
(D) removing a portion of the second substrate of the donor wafer from the handle wafer to leave a thin layer of the undoped silicon layer from the donor wafer on top to form an SOI channel.

The thin SiGe layer from the donor wafer may optionally be left on top to form an SOI channel. Removal of the portion of the second substrate of the donor wafer can be accomplished using back-etch SOI or SIMOX techniques that are known in the art. Most typically, a "Smart-Cut®" method is used to remove the portion of the second substrate of the donor wafer from the handle wafer.

The above method may further comprise implanting ions into the first substrate after the portion of the second substrate is removed from the handle wafer. When implanting ions, it is desirable to locate a peak concentration of ions at an interface of the conducting layer and the epitaxial diffusion-retarding semiconductor layer. This can be accomplished by adjusting the energy and dopant dosage according to methods well known in the art.

The first substrate of the handle wafer may be undoped or predoped. The thin oxide layers may be prepared by depositing the thin oxide layer over the top of the substrate, or by using dry/wet oxidation techniques. The epitaxial diffusion-retarding semiconductor layer typically comprises elemental semiconductor material or compound semiconductor material, has low or no defects (e.g., stacking faults, dislocation pipes, etc.), and is about 10 to about 30 nanometers thick. More typically, the epitaxial diffusion-retarding semiconductor layer comprises Si:C, wherein Si:C has about 1-2% C, or SiGe. The amount of defects in the epitaxial diffusion-retarding semiconductor layer directly correlates with the amount of C in Si:C. The C concentration in the Si:C also correlates with the diffusion rate of dopant through the epitaxial diffusion-retarding semiconductor layer. Therefore, by incorporating more than 1% C, a thinner epitaxial diffusion-retarding semiconductor layer may be used.

The epitaxial diffusion-retarding semiconductor layer, which is crystalline in nature, slows the diffusion rate of ground-plane ("GP") dopant, such as boron, phosphorous, indium, or arsenic, from the substrate into the SOI channel. The dopant concentration in the SOI channel of the devices of the present disclosure, which comprise an epitaxial diffusion-retarding semiconductor layer, are approximately 50 times less after exposure to FEOL thermal budget than the dopant concentration in SOI channels of devices without the epitaxial diffusion-retarding semiconductor layer.

BRIEF DESCRIPTION OF THE DRAWINGS

FIGS. 1A-1 and 1A-2 are pictorial representations (through a cross-sectional view) of a handle wafer utilized in the present disclosure wherein the handle wafer is comprised of an epitaxial diffusion-retarding semiconductor layer on top of either an undoped substrate or a predoped substrate.

FIGS. 1C-1 and 1C-2 are pictorial representations (through a cross-sectional view) of the wafer device that results after the structure depicted in FIG. 1B is bonded to the structure of FIG. 1A-1 or 1A-2.

FIGS. 1D-1 and 1D-2 are pictorial representations (through a cross-sectional view) of the ultra-thin-body-and-BOX fully depleted SOI device that results after a portion of the second substrate of the donor wafer is removed from the handle wafer to form an SOI channel.

FIGS. 1E-1 and 1E-2 are pictorial representations (through a cross-sectional view) illustrating the structure of FIGS. 1D-1 and 1D-2 during ion implantation of a dopant.

FIGS. 2A-1 and 2A-2 are pictorial representations (through a cross-sectional view) depicting a completed Double BOX fully depleted SOI device. The conducting layer is sandwiched between the two BOX layers. The epitaxial diffusion-retarding semiconductor resides directly under the top oxide layer and above the conducting layer.

DESCRIPTION OF BEST AND VARIOUS EMBODIMENTS OF DISCLOSURE

Figure 1B:
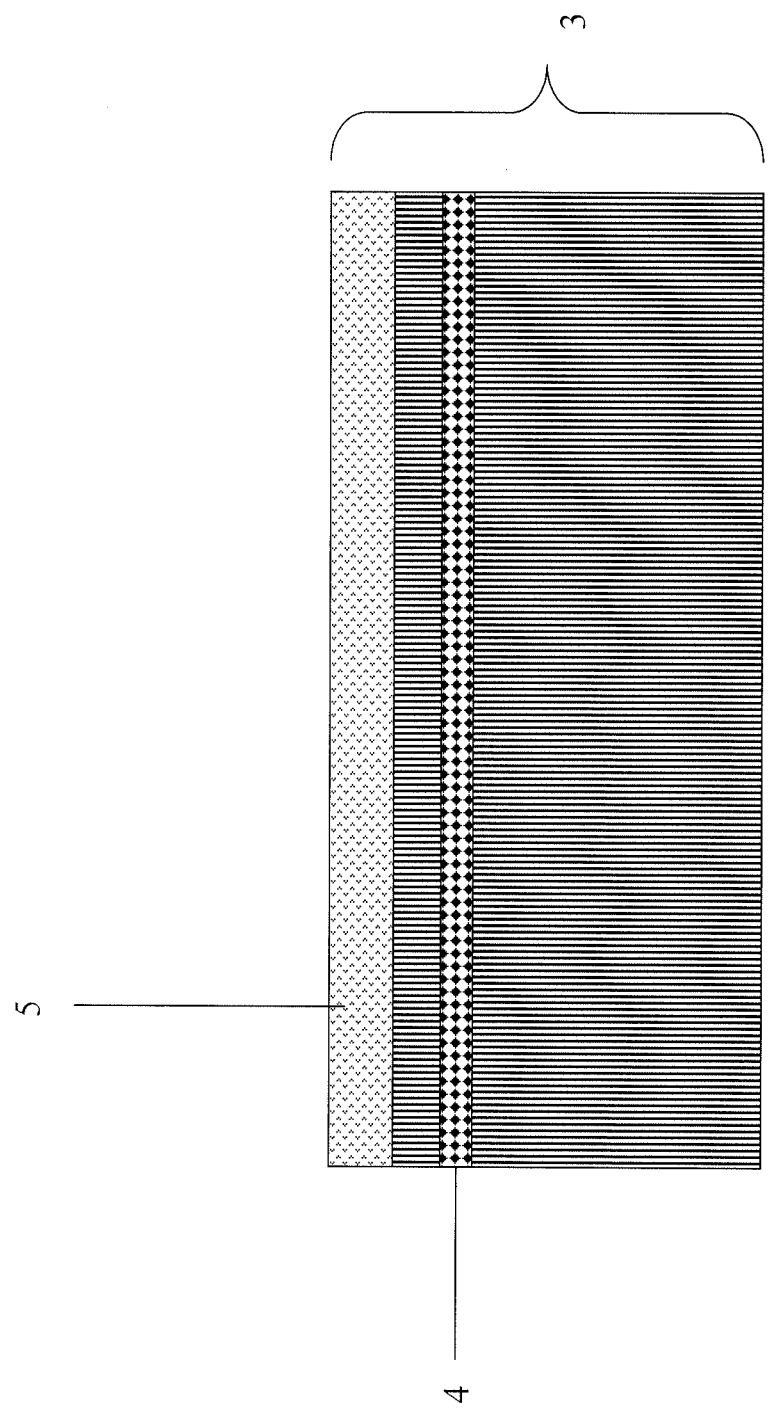
FIG. 1B is a pictorial representation (through a cross-sectional view) of a donor wafer utilized in the present disclosure wherein the donor wafer is comprised of a thin oxide layer on top of a substrate.

The present disclosure, which is directed to ultra-thin-body-and-BOX and Double BOX fully depleted SOI devices having an epitaxial diffusion-retarding semiconductor layer that slows the diffusion rate of dopant from a substrate into the SOI channel, and a method of making these devices, will now be described in greater detail by referring to the drawings that accompany the present application. It is noted that in the accompanying drawings, like reference numerals are used for describing like and/or corresponding elements.

Reference is first made to FIGS. 1A-1F which illustrate the basic processing steps of the present disclosure that are capable of forming ultra-thin-body-and-BOX fully depleted SOI devices having an epitaxial diffusion-retarding semiconductor layer that slows dopant diffusion from the substrate into the SOI channel. FIGS. 1A-1 and 1A-2 demonstrate the first step of preparing a handle wafer by providing either an undoped first substrate 1a or a doped first substrate 1b comprising an epitaxial diffusion-retarding semiconductor layer 2.

The epitaxial diffusion-retarding semiconductor layer 2 usually comprises an elemental semiconductor material or a compound semiconductor material, has low or no defects, and is about 10 to about 30 nanometers thick. More typically, the epitaxial diffusion-retarding semiconductor layer 2 comprises Si:C wherein Si:C comprises about 1-2% C, or SiGe.

Figure 1C:
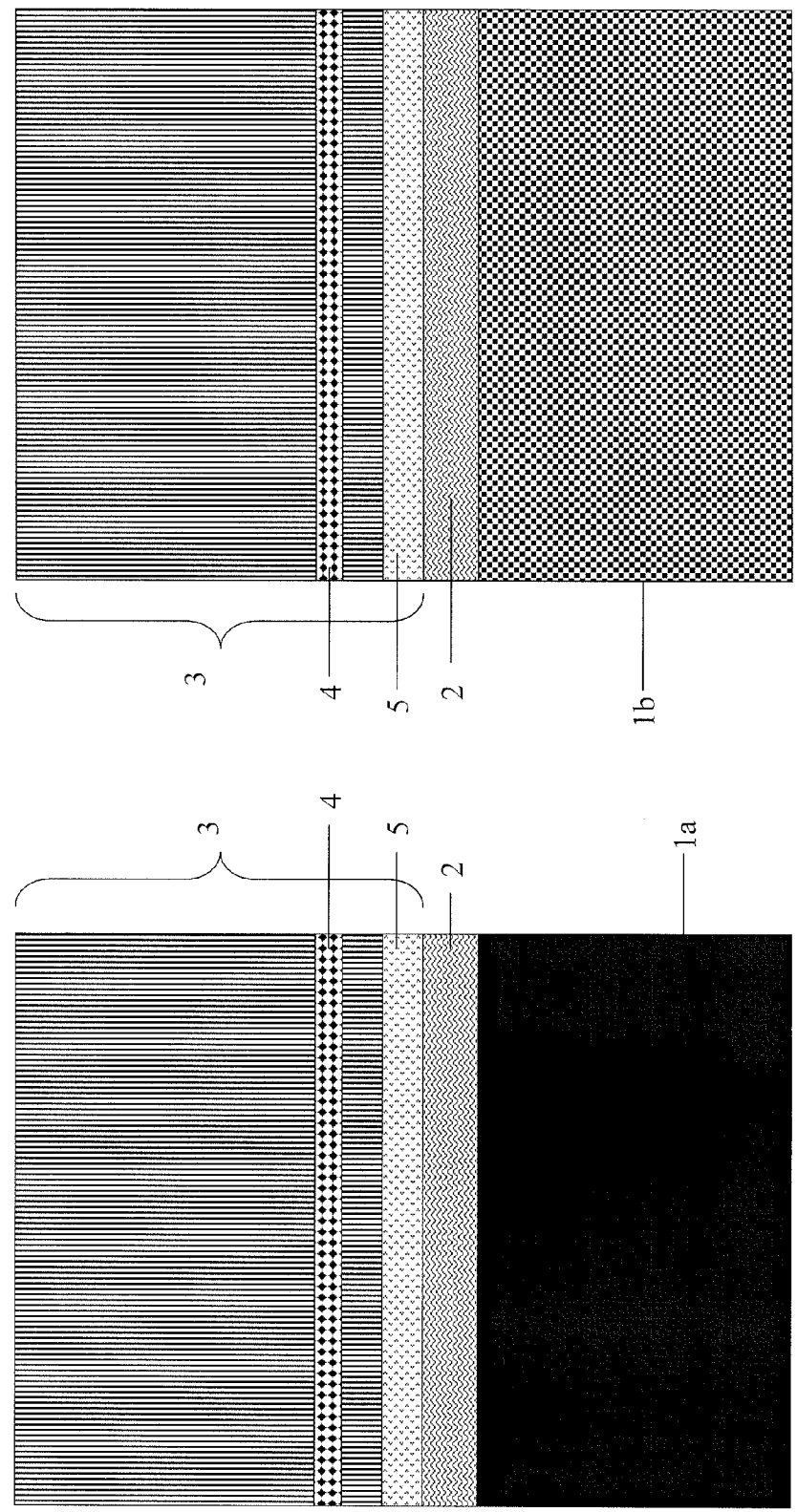

FIG. 1B depicts the donor wafer 3 that is provided in the present disclosure. The donor wafer 3 comprises defects 4 as well as a thin oxide layer 5. Next, FIGS. 1C-1 and 1C-2 illustrate the step of the instant disclosure wherein the thin oxide layer 5 of the donor wafer 3 is bonded to the epitaxial diffusion-retarding semiconductor layer 2 of the first substrate 1a or 1b.

Figure 1D:
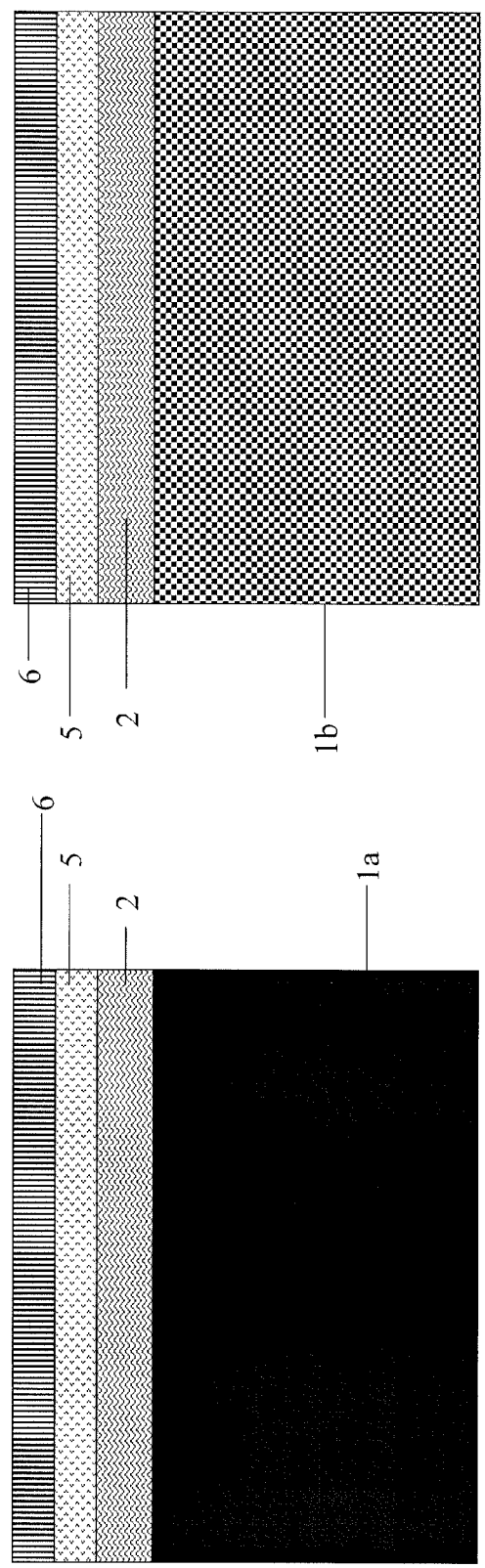

Once the donor wafer 3 is bonded to the handle wafer 1a or 1b, a portion of the donor wafer 3 is removed from the handle wafer thereby creating an SOI channel layer 6 as shown in FIGS. 1D-1 and 1D-2. Typically, the portion of the donor wafer 3 that is removed includes the defect layer 4 such that only the thin oxide layer 5, and the layer of undoped substrate that was between the thin oxide layer 5 and the defect layer 4 of the original donor wafer 3 remains attached to the handle wafer. Most typically, a "Smart-Cut®" approach is used to remove the portion of the donor wafer 3 from the handle wafer. This process is similar to BESOI, but instead of thinning by etching, a hydrogen layer that is implanted prior to bonding is used, and the bulk silicon is fractured after bonding to leave behind a thin device layer. In other words, in the Smart-Cut® process, hydrogen implantation and annealing are used to fracture the bulk of the device wafer (i.e., the donor wafer) from the bonded wafers. Chemical-mechanical polishing (CMP) is then used to planarize and minimize non-uniformity of the as-cut SOI wafer. The Smart-Cut® method is well known in the art and is described in detail in, for example, U.S. Pat. No. 5,374,564, U.S. Pat. No. 5,882,987, and U.S. Pat. No. 6,365,488, all of which are incorporated herein by reference.

Figure 1E:
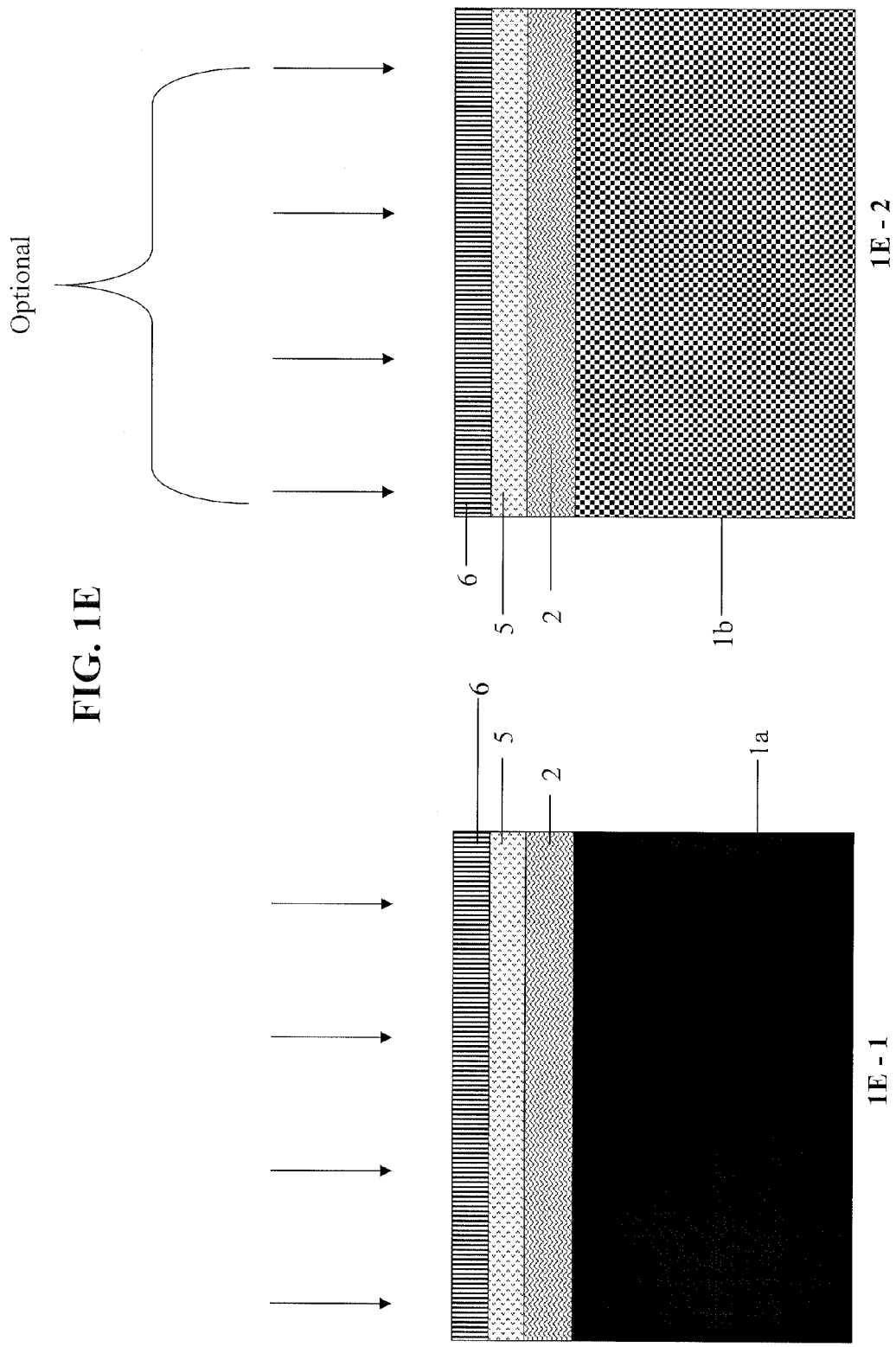

After the SOI channel layer 6 is created, the first substrate 1a of the handle wafer is implanted with dopants using an ion implantation technique to form the GP as shown in FIGS. 1E-1 and 1E-2. The energy and dopant dosage is adjusted during this process such that the peak of dopant implantation is at an interface of the epitaxial diffusion-retarding semiconductor layer 2 and the thin oxide layer 5. The ion implantation technique can optionally be used in a similar manner to implant dopants into the doped first substrate 1b of the handle wafer. After exposure to FEOL thermal budget, the epitaxial diffusion-retarding semiconductor layer 2 slows the diffusion of dopant into the SOI channel layer 6.

Figure 2A:
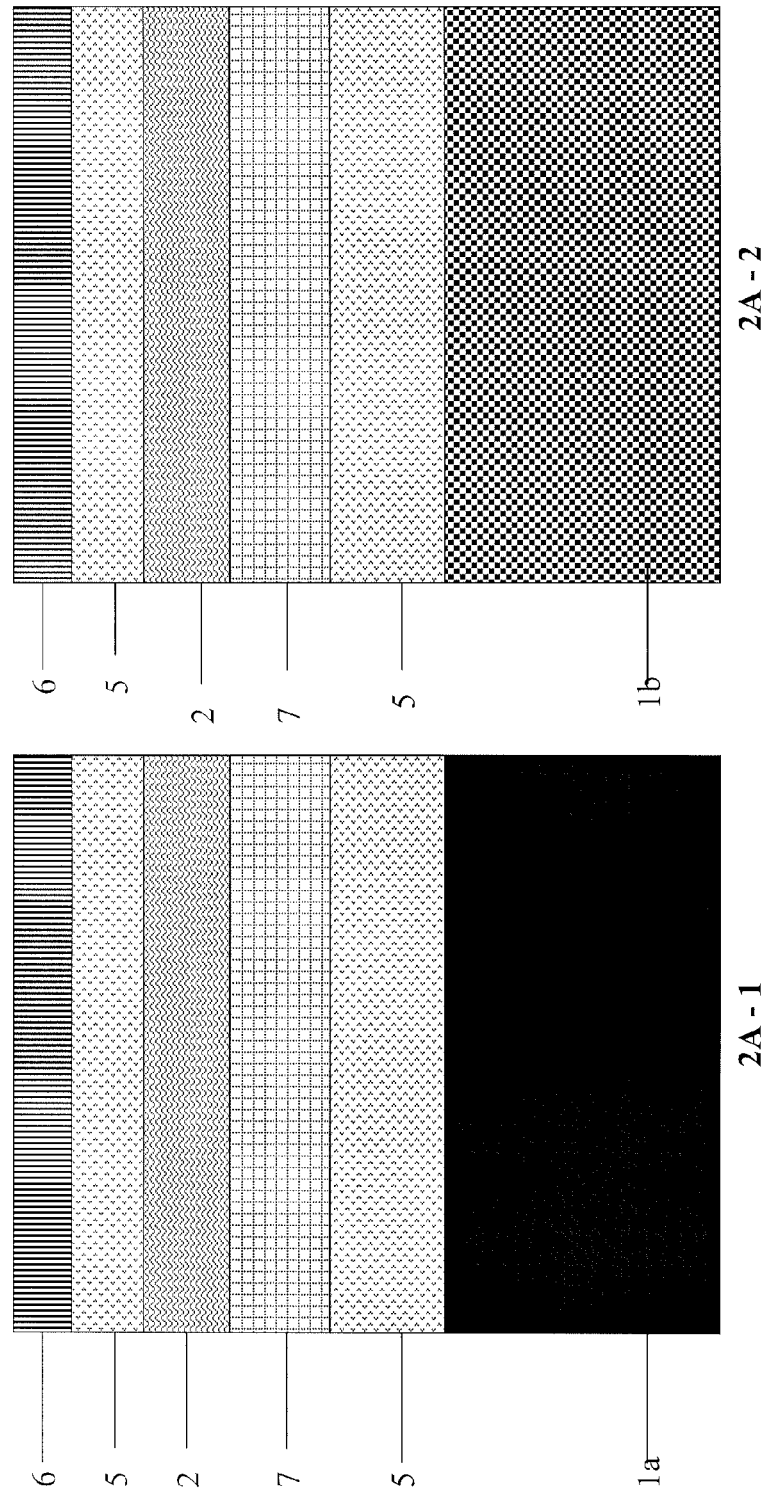

Reference is next made to FIGS. 2A-1 and 2A-2 which depict a Double BOX fully depleted SOI embodiment of the present disclosure. This embodiment comprises an epitaxial diffusion-retarding semiconductor layer 2 between the top buried oxide layer 5 (closer to the SOI channel 6) and a conducting layer 7. The dopant concentration in the SOI channel of the Double BOX devices of the present disclosure, which comprise an epitaxial diffusion-retarding semiconductor layer 2, is approximately 50 times less after exposure to FEOL thermal budget than the dopant concentration in the SOI channel of similar Double BOX devices without the epitaxial diffusion-retarding semiconductor layer.

Figure 3A:
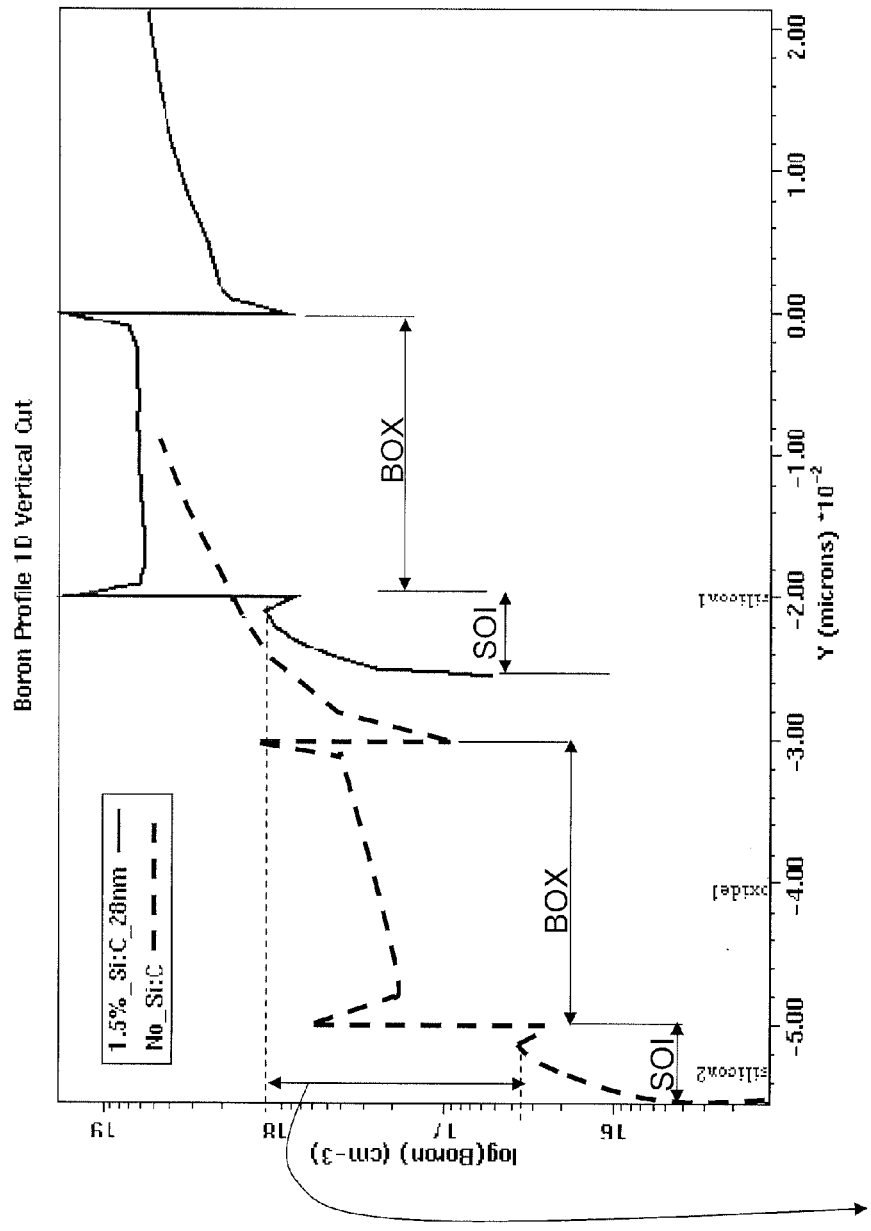
FIG. 3A is a graphical representation of process simulation results showing the boron concentration in the SOI channel of a device of the present disclosure after exposure to FEOL thermal budget. The graph demonstrates that the boron concentration in the SOI channel was reduced by approximately 50 times in the device of the present disclosure with an epitaxial diffusion-retarding semiconductor layer between the substrate and buried oxide layer, as compared to a similar device without the epitaxial diffusion-retarding semiconductor layer.

FIG. 3A is a graphical representation of the Boron concentration in the SOI channel of a device of the present disclosure after the device has been exposed to FEOL thermal budget. The graph demonstrates that the Boron concentration in the SOI channel was reduced by approximately 50 times in the device of the present disclosure, which has an epitaxial diffusion-retarding semiconductor layer between the substrate and buried oxide layer, as compared to a similar device without the epitaxial diffusion-retarding semiconductor layer. The ultra-thin-body-and-BOX aspect of the disclosure is further illustrated in the following non-limiting example which is described below.

EXAMPLE 1

TCAD simulations on ultra-thin-body-and-BOX devices of the present disclosure were performed. The devices comprised an in-situ doped substrate having an Si:C epitaxial diffusion-retarding semiconductor layer between a thin oxide layer and GP layer. The simulations account for the entire FEOL thermal budget, and show the boron concentration at the end of the process for devices with an Si:C layer and devices without an Si:C layer. In particular, the simulations showed that the devices having a sufficiently thick (10-30 nanometers) Si:C layer with 1% C epitaxial film inserted between the Si substrate and the GP layer slowed boron diffusion into the SOI channel approximately 50 times better than the devices without the Si:C layer after exposure to FEOL thermal budget.

Still other objects and advantages of the present disclosure will become readily apparent by those skilled in the art from the preceding detailed description, wherein it is shown and described preferred embodiments, simply by way of illustration of the best mode contemplated. As will be realized the disclosure is capable of other and different embodiments, and its several details are capable of modifications in various obvious respects, without departing from the disclosure. Accordingly, the description is to be regarded as illustrative in nature and not as restrictive.

The term "comprising" (and its grammatical variations) as used herein is used in the inclusive sense of "having" or "including" and not in the exclusive sense of "consisting only of." The term "consisting essentially of" as used herein is intended to refer to including that which is explicitly recited along with what does not materially affect the basic and novel characteristics of that recited or specified. The terms "a" and "the" as used herein are understood to encompass the plural as well as the singular.

What is claimed is:

1. An ultra-thin-body-and-buried-oxide (BOX) fully depleted SOI device comprising a first doped substrate; an epitaxial semiconductive layer comprising SiC and/or SiGe on top of and in direct contact with the first doped substrate; a thin oxide layer on top of and in direct contact with the epitaxial semiconductive layer; and an SOI channel layer on top of and in direct contact with the thin oxide layer; wherein the epitaxial semiconductive layer slows the rate of dopant diffusion from the substrate into the SOI channel.

2. A complimentary-symmetry metal-oxide-semiconductor (CMOS) device comprising the ultra-thin-body-and-buried-oxide (BOX) fully depleted SOI device according to claim 1.

3. The ultra-thin-body-and-buried-oxide (BOX) fully depleted SOI device of claim 1, wherein the rate of dopant diffusion from the substrate into the SOI channel is slowed by about 50 times in comparison to an ultra-thin-body-and-buried-oxide (BOX) fully depleted SOI device without the epitaxial semiconductive layer.

4. A complimentary-symmetry metal-oxide-semiconductor (CMOS) device comprising the ultra-thin-body-and-buried-oxide (BOX) fully depleted SOI device according to claim 3.

5. The ultra-thin-body-and-buried-oxide (BOX) fully depleted SOI device of claim 3, wherein the dopant is boron.

6. The ultra-thin-body-and-buried-oxide (BOX) fully depleted SOI device of claim 1, wherein the epitaxial semiconductive layer is about 10 to about 30 nanometers thick.

* * * * *